United States Patent
Kenichiro et al.

(10) Patent No.: US 12,007,744 B2
(45) Date of Patent: Jun. 11, 2024

(54) ABATEMENT SYSTEM, ABATEMENT DEVICE, AND SYSTEM CONTROL DEVICE

(71) Applicants: Edwards Japan Limited, Yachiyo (JP); Edwards Limited, Burgess Hill (GB)

(72) Inventors: Kobayashi Kenichiro, Yachiyo (JP); Adrian Fisher, Burgess Hill (GB); Christopher Peter Jones, Burgess Hill (GB); Philip Carr, Burgess Hill (GB)

(73) Assignees: Edwards Japan Limited, Yachiyo (JP); Edwards Limited, Burgess Hill (GB)

( * ) Notice: Subject to any disclaimer, the term of this patent is extended or adjusted under 35 U.S.C. 154(b) by 352 days.

(21) Appl. No.: 17/264,204

(22) PCT Filed: Aug. 5, 2019

(86) PCT No.: PCT/JP2019/030790
§ 371 (c)(1),
(2) Date: Jan. 28, 2021

(87) PCT Pub. No.: WO2020/031990
PCT Pub. Date: Feb. 13, 2020

(65) Prior Publication Data
US 2021/0302935 A1   Sep. 30, 2021

(30) Foreign Application Priority Data

Aug. 6, 2018  (JP) .................................. 2018-147339
Aug. 2, 2019  (JP) .................................. 2019-142851

(51) Int. Cl.
*G05B 19/4063*   (2006.01)
*G05B 19/18*     (2006.01)
(Continued)

(52) U.S. Cl.
CPC ....... *G05B 19/4063* (2013.01); *G05B 19/182* (2013.01); *G05B 19/4067* (2013.01);
(Continued)

(58) Field of Classification Search
CPC .............. G05B 19/4063; G05B 19/182; G05B 19/4067; G05B 19/40938;
(Continued)

(56) References Cited

U.S. PATENT DOCUMENTS 5,259,731 A * 11/1993 Dhindsa ................ F04B 49/065
                                              417/63
5,971,711 A * 10/1999 Noji ........................ F04D 25/16
                                               417/2
(Continued)

FOREIGN PATENT DOCUMENTS

EP   1344941 A1   9/2003
EP   2264558 A2   12/2010
(Continued)

OTHER PUBLICATIONS

Translation and Original International Search Report from counterpart International Application No. PCT/JP2019/030790 dated Oct. 1, 2019, 8 pp.
(Continued)

*Primary Examiner* — Christopher E. Everett
(74) *Attorney, Agent, or Firm* — Shumaker & Sieffert, P.A.

(57) ABSTRACT

A plurality of system control devices respectively include network interfaces for communicating with each other via a network. One of the plurality of system control devices functions as a master system control device, and the remaining system control devices function as slave system control devices. The master system control device transmits a control command to the slave system control devices by means of the network interface. The slave system control devices receive the control command by means of the network interfaces and supply an operation command to abatement devices in accordance with the control command. When unable to communicate with the master system control (Continued)

device, the slave system control devices either function as master system control devices or enter stand-alone operation mode.

11 Claims, 5 Drawing Sheets

(51) Int. Cl.
    *G05B 19/4067*      (2006.01)
    *G05B 19/4093*      (2006.01)
    *H01L 21/02*      (2006.01)

(52) U.S. Cl.
    CPC .. *G05B 19/40938* (2013.01); *H01L 21/02337* (2013.01); *G05B 2219/2231* (2013.01); *G05B 2219/2234* (2013.01); *G05B 2219/2602* (2013.01)

(58) Field of Classification Search
    CPC .... G05B 2219/2231; G05B 2219/2234; G05B 2219/2602; G05B 19/4185; G05B 19/0421; G05B 2219/2233; G05B 2219/23074; G05B 9/02; G05B 9/03; H01L 21/02337; H01L 21/67017; Y02P 90/02; B01D 53/346; B01D 2258/0216
    See application file for complete search history.

(56) References Cited

U.S. PATENT DOCUMENTS

| | | | |
|---|---|---|---|
| 8,455,368 | B2 | 6/2013 | Chandler et al. |
| 2003/0175112 | A1* | 9/2003 | Namiki ................. F04D 25/16 |
| | | | 415/90 |
| 2008/0047586 | A1* | 2/2008 | Loldj ..................... B01D 53/30 |
| | | | 134/18 |
| 2008/0262655 | A1* | 10/2008 | Smith ................ G05B 19/4185 |
| | | | 700/247 |
| 2014/0352820 | A1 | 12/2014 | Nakazawa et al. |
| 2018/0225244 | A1* | 8/2018 | Dorneanu ............. G06F 13/374 |
| 2020/0399755 | A1* | 12/2020 | Okuno .................. B01D 53/38 |

FOREIGN PATENT DOCUMENTS

| | | |
|---|---|---|
| JP | H10-312968 A | 11/1998 |
| JP | 2007312043 A | 11/2007 |
| JP | 2010528475 A | 8/2010 |
| KR | 20140141513 A | 12/2014 |

OTHER PUBLICATIONS

Extended Search Report from counterpart European Application No. 19846400.0 dated Mar. 28, 2022, 8 pp.
Office Action from counterpart KR Application No. 10-2021-7002281 dated Dec. 26, 2023, 4 pp (No translation available).

\* cited by examiner

ABATEMENT SYSTEM, ABATEMENT DEVICE, AND SYSTEM CONTROL DEVICE

This application is a U.S. national phase application under 35 U.S.C. § 371 of international application number PCT/JP2019/030790 filed on Aug. 5, 2019, which claims the benefit of priority to JP application number 2019-142851 filed Aug. 2, 2019 and 2018-147339 filed Aug. 6, 2018. The entire contents of each of international application number PCT/JP2019/030790, JP application number 2019-142851 and JP application number 2018-147339 are incorporated herein by reference.

TECHNICAL FIELD

The present disclosure relates to an abatement system, an abatement device, and a system control device.

BACKGROUND

A certain system includes two abatement devices and a controller, wherein the controller causes exhaust gas of a semiconductor manufacturing device to flow into one of the abatement devices at the time of film formation and causes cleaning gas to flow into the other abatement device at the time of cleaning (see Japanese Patent Application Publication No. H10-312968, for example).

SUMMARY

However, an abatement system can be provided with a plurality of abatement devices and one system control device, wherein some of the plurality of abatement devices can be used during normal operation, the remaining abatement devices as backup abatement devices, and the system control device can centrally manage the operating statuses of these abatement devices.

However, when the system control device stops due to a failure or power shutdown or when communications between the system control device and the abatement devices fail while the system control device centrally manages all of the abatement devices within the system, the operation of the entire system stops, making it difficult for the abatement devices to continue the abatement treatment even if each individual abatement device can be operated.

The present disclosure has been contrived in view of the foregoing problems, and an object thereof is to obtain an abatement system that continues an abatement treatment by an abatement device even when it becomes difficult for a specific system control device to centrally manage the system, and an abatement device and a system control device that can be used in said abatement system.

An abatement system according to the present disclosure includes a plurality of abatement devices and a plurality of system control devices that are provided corresponding to the plurality of abatement devices and supply an operation command to a corresponding abatement device out of the plurality of abatement devices. The plurality of system control devices respectively include network interfaces for communicating with each other through a network. Any one of the plurality of system control devices functions as a master system control device, and remaining system control devices of the plurality of system control devices function as slave system control devices. The master system control device transmits a control command to the slave system control devices by means of the network interfaces, and the slave system control devices receive the control command by means of the network interfaces and supply the operation command to the corresponding abatement device in accordance with the received control command. When unable to communicate with the master system control device, the slave system control devices either function as new master system control devices or enter stand-alone operation mode. In the stand-alone operation mode, the operation command is supplied to the corresponding abatement device in accordance with a predetermined setting.

An abatement devices according to the present disclosure includes an abatement device main body and a system control device that supplies an operation command to the abatement device main body. The system control device includes a network interface for communicating with a system control device of another abatement device through a network, and functions as a slave system control device. The system control device of said another other abatement device functions as a master system control device. The master system control device transmits a control command to another system control device functioning as a slave system control device. The slave system control device receives the control command from the master system control device by means of the network interface, and supplies an operation command to the abatement device main body in accordance with the received control command. When unable to communicate with the master system control device, the slave system control device either functions as a new master system control device or enters stand-alone operation mode. The new master system control device transmits a control command to another system control device functioning as another slave system control device. In the stand-alone operation mode, the operation command is sent to the abatement device main body in accordance with a predetermined setting.

A system control device according to the present disclosure includes a network interface for communicating with the system control device of another abatement device through a network. The system control device functions as a slave system control device, and the system control device of said another abatement device functions as a master system control device. The master system control device transmits a control command to said another system control device functioning as a slave system control device by means of the network interface. The slave system control device receives the control command from the master system control device by means of the network interface, and supplies an operation command to the abatement device in accordance with the received control command. When unable to communicate with the master system control device, the slave system control device either functions as a master system control device or enters stand-alone operation mode. The new master system control device transmits a control command to another system control device functioning as another slave system control device. In the stand-alone operation mode, the operation command is sent to the abatement devices in accordance with a predetermined setting.

Accordingly, the present disclosure can obtain an abatement system that continues an abatement treatment by an abatement device even when it becomes difficult for a specific system control device to centrally manage the system, and an abatement device and a system control device that can be used in said abatement system.

The foregoing and other objects, characteristics, and advantages of the present disclosure will become more apparent hereinafter from the following detailed description along with the accompanying drawings.

DETAILED DESCRIPTION

Embodiments of the present disclosure are now described hereinafter with reference to the drawings.

Embodiment 1

Figure 1:
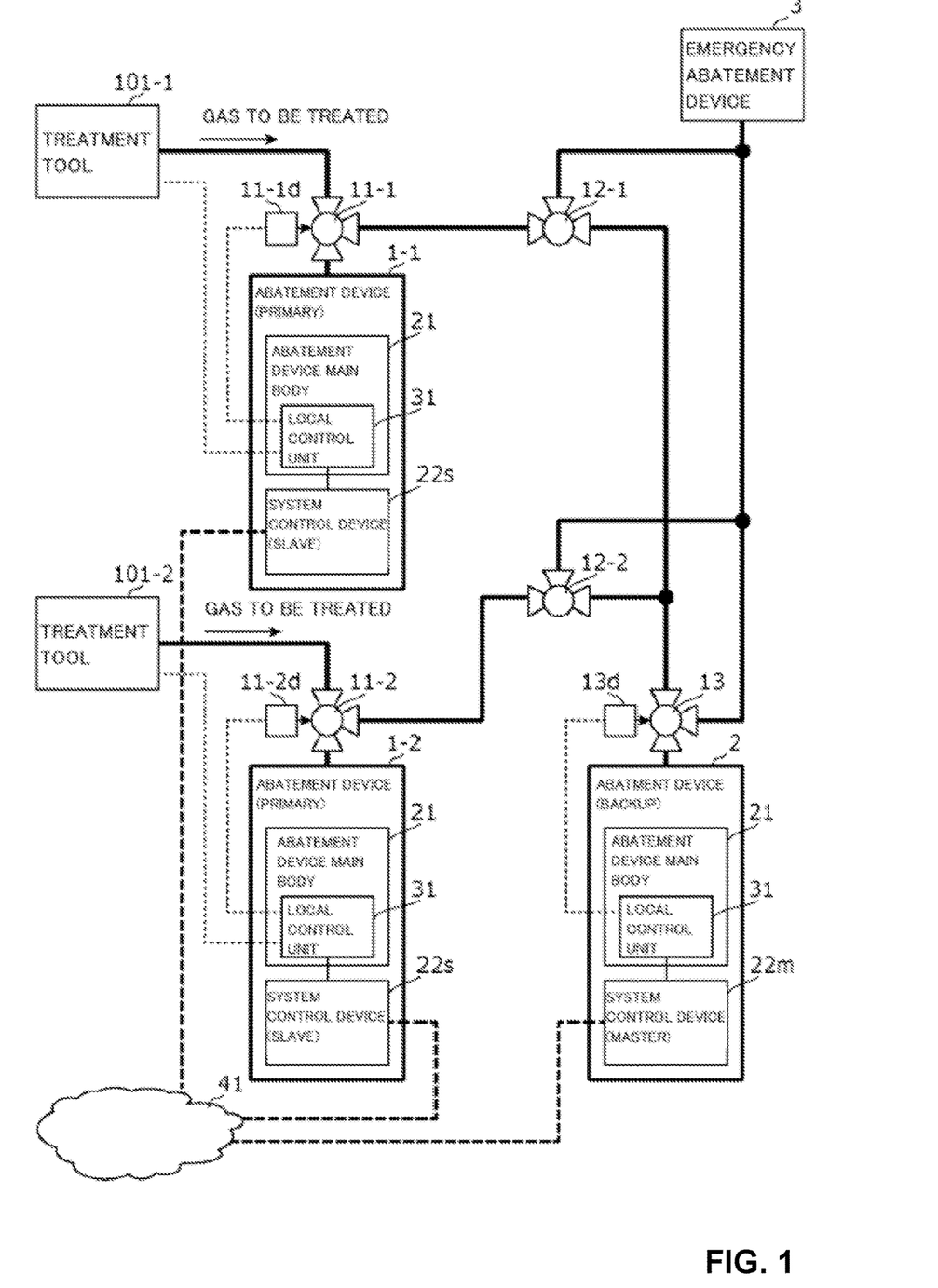
FIG. 1 is a block diagram showing a configuration of an abatement system according to Embodiment 1 of the present disclosure.

FIG. 1 is a block diagram showing a configuration of an abatement system according to Embodiment 1 of the present disclosure. The abatement system shown in FIG. 1 causes a plurality of abatement devices 1-1, 1-2, 2 to execute an abatement treatment on gas to be treated that is discharged from a plurality of treatment tools 101-1, 101-2.

The treatment tools 101-1, 101-2 are each a device or equipment that performs specific treatment steps in semiconductor manufacturing and the like, and in the treatment steps the treatment tools 101-1, 101-2 discharge gas (gas to be treated) containing substances that require abatement before being released to the environment.

The abatement devices 1-1, 1-2, 2 execute an abatement treatment using an abatement treatment method (combustion method, electric heating method, plasma method, catalyst degradation method, adsorption method, scrubber method, etc.) suitable for abatement of the gas to be treated that is discharged from the treatment tools 101-1, 101-2. In the present embodiment, the abatement devices 1-1, 1-2, 2 are each a combustion-type abatement device.

The abatement system shown in FIG. 1 includes the plurality of abatement devices 1-1, 1-2, 2 and an emergency abatement device 3. In the present embodiment, the abatement devices 1-1, 1-2 are primary abatement devices that temporarily perform an abatement treatment on the gas to be treated that is discharged from the treatment tools 101-1, 101-2, respectively. The abatement device 2 is a backup abatement device for the abatement devices 1-1, 1-2. In the present embodiment, one backup abatement device 2 is provided for the plurality of abatement devices 1-1, 1-2. Note that the emergency abatement device 3 temporarily executes an abatement treatment in a case where an abnormality occurs in the abatement devices 1-1, 1-2, 2.

A main flow channel for the gas to be treated is formed by a conduit so as to extend from the treatment tool 101-1 to the abatement device 1-1, and a bypass valve 11-1 is provided on this main flow channel. Furthermore, a backup flow channel is formed by means of piping so as to extend from the bypass valve 11-1 to the abatement device 2. A bypass valve 12-1 for emergency discharge is provided on the backup flow channel, and a flow channel for emergency discharge is provided so as to extend from the bypass valve 12-1 to the emergency abatement device 3. A stage subsequent to the treatment tool 101-1 is provided with a pump, not shown, and the gas to be treated is caused to flow along a flow channel by this pump. Similarly, a main flow channel for the gas to be treated is formed by a conduit so as to extend from the treatment tool 101-2 to the abatement device 1-2, and a bypass valve 11-2 is provided on this main flow channel. Furthermore, a backup flow channel is formed by means of piping so as to extend from the bypass valve 11-2 to the abatement device 2. A bypass valve 12-2 for emergency discharge is formed on this backup flow channel, and a flow channel for emergency discharge is provided so as to extend from the bypass valve 12-2 to the emergency abatement device 3. A stage subsequent to the treatment tool 101-2 is provided with a pump, not shown, and the gas to be treated is caused to flow along a flow channel by this pump. A stage above the backup abatement device 2, too, is provided with a bypass valve 13, and a flow channel for emergency discharge is provided so as to extend from the bypass valve 13 to the emergency abatement device 3. Note that these bypass valves 11-1, 11-2, 12-1, 12-2, 13 are three-way valves.

Each of the abatement devices 1-1, 1-2, 2 has an abatement device main body 21 and a system control device 22s, 22m.

The abatement device main body 21 is a device provided in each of the abatement devices 1-1, 1-2, 2. The gas to be treated is introduced into the abatement device main body 21 through an inlet, and the abatement device main body 21 performs an abatement treatment on the gas to be treated. A local control unit 31 that electrically controls an internal device of the abatement device main body 21 is built into the abatement device main body 21.

The local control unit 31 is a control IC (Integrated Circuit), a microprocessor that executes a control program, or the like. The local control unit 31 controls the abatement treatment in accordance with commands from the treatment tools 101-1, 101-2. For example, the treatment tools 101-1, 101-2 each issue, to the local control unit 31, a command indicating a flow rate of the gas to be treated at the treatment tools 101-1, 101-2, and the local control unit 31 controls an internal device (a reactor, etc.), not shown, in response to said command, so that the abatement treatment is performed properly based on the flow rate of the gas to be treated.

In addition, the bypass valves 11-1, 11-2, 13 are provided with valve drive units 11-1d, 11-2d, 13d, respectively. The valve drive units 11-1d, 11-2d, 13d drive the bypass valves 11-1, 11-2, 13 to switch the flow channels. The local control unit 31 controls the valve drive unit of the bypass valve associated with the local control unit 31 (such as the bypass valve in the stage above the abatement device 1-1, 1-2, 2 in each of which the local control unit 31 is built), and switches the flow channel of such bypass valve. For example, the valve drive units 11-1d, 11-2d, 13d are each a hydraulic-type, pneumatic-type, or electric-type rotary actuator. The bypass valves 12-1, 12-2, too, are provided with valve drive units (not shown), but the description thereof are omitted.

A certain local control unit 31 issues, to the corresponding treatment tool 101-1, 101-2, status information on the abatement device (the abatement device main body 21) in which said local control unit 31 is built, and status information on another abatement device that is acquired from another system control device by the system control device of the abatement device in which said local control unit 31 is built. In other words, in regard to the treatment tool 101-1, the status information on the abatement devices 1-1, 2 that are likely to perform an abatement treatment on the gas to be treated discharged from the treatment tool 101-1 are issued from the local control unit 31 of the abatement device 1-1 to the treatment tool 101-1. In regard to the treatment tool 101-2, the status information on all of the abatement devices 1-2, 2 that are likely to perform an abatement treatment on the gas to be treated discharged from the treatment tool 101-2 are issued from the local control unit 31 of the abatement device 1-2 to the treatment tool 101-2.

In addition, of the plurality of abatement devices 1-1, 1-2, 2, the abatement devices 1-1, 1-2 function as the primary abatement devices that temporarily perform an abatement treatment on the gas to be treated that is discharged from predetermined treatment tools 101-1, 101-2, respectively. The abatement device 2 functions as the backup abatement device for the abatement devices 1-1, 1-2. In a case where either one of the abatement devices 1-1, 1-2 stops, the abatement device 2 executes an abatement treatment on behalf of the stopped abatement device.

Therefore, the system control device 22s of the primary abatement device (abatement device 1-i, where i=1, 2) acquires the status information on the abatement device 2 of the other system control device 22m from said system control device 22m, and the local control unit 31 of the primary abatement device issues, to the treatment tool, the status information on the abatement device 1-i of the system control device 22s and the status information on the abatement device 2 of said other system control device 22m that is acquired by the system control device 22s.

Note that the status information on each abatement device contains an operating status (operating, sleeping, stopped, etc.), a maintenance request level, and the like, as necessary. Examples of the maintenance request level include the degree of accumulation of solid deposits caused by sublimation of the gas to be treated, the length of time that has elapsed since the last maintenance, the total amount of treated gas since the last maintenance, and the like.

Based on such status information, for example, the treatment tools 101-1, 101-2 can adjust the flow rate of the gas to be treated in consideration of the state of the abatement system.

Furthermore, the plurality of system control devices 22m, 22s are provided so as to correspond to the plurality of abatement devices 1-1, 1-2, 2, and supply operation commands (start of operation (abatement treatment), transition to sleep mode, stop the operation, etc.) to the corresponding abatement devices (the abatement device main bodies 21) of the plurality of abatement devices 1-1, 1-2, 2.

Of the plurality of system control devices 22m, 22s, the system control device 22m operates as a master system control device, and the remaining system control devices 22s operate as slave system control devices. During a normal system operation, the master system control device centrally manages the operating status of the system, and transmits a control command to the slave system control devices. The slave system control devices output operation commands to the corresponding abatement device main bodies 21 in response to the control command. Of the plurality of system control devices 22m, 22s, one or more system control devices may function as the master system control devices.

In this embodiment, the system control device 22m of the backup abatement device (that is, the abatement device 2) is set as the master system control device, and the system control devices 22s of the primary abatement devices (that is, the abatement devices 1-1, 1-2) are set as the slave system control devices.

Figure 2:
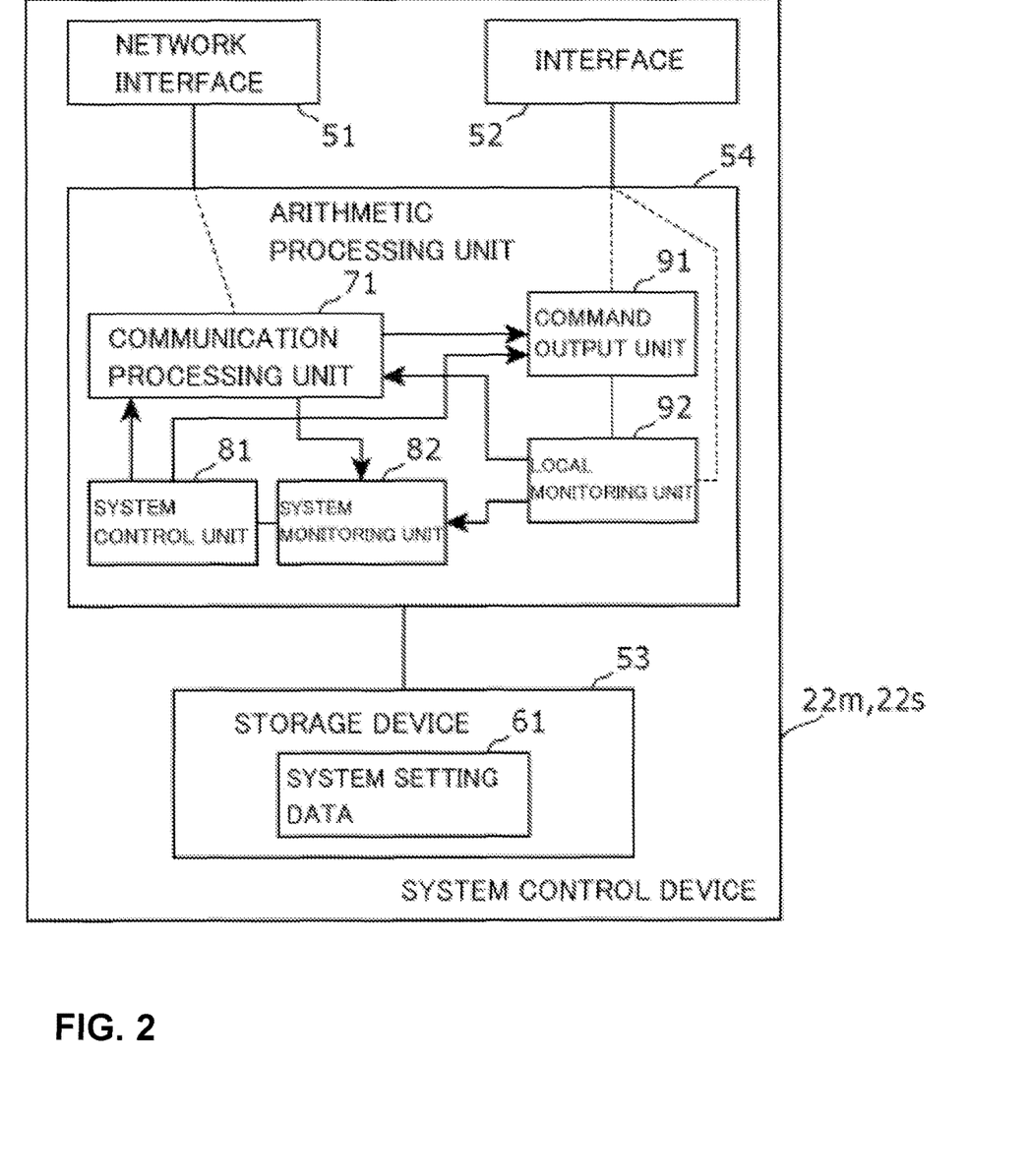
FIG. 2 is a block diagram showing a configuration of system control devices of FIG. 1.

FIG. 2 is a block diagram showing a configuration of the system control devices 22m, 22s of FIG. 1. The system control devices 22m, 22s shown in FIG. 2 each include a network interface 51, an interface 52, a storage device 53, and an arithmetic processing unit 54.

The network interfaces 51 are communication devices that communicate with each other via a network 41. In this embodiment, the network 41 is an IP (Internet Protocol) network, and a TCP (Transmission Control Protocol) or the like can be used as a host protocol in the network 41.

The interface 52 is a circuit that inputs/outputs signals to/from the local control units 31 of the abatement device main bodies 21. The signals include a signal for supplying an operation command from the system control device 22m, 22s to the abatement device main body 21, a signal for issuing the status information on the abatement device main body 21 from the abatement device main body 21 to the system control device 22m, 22s, and the like. Note that these signals may be realized as voltage levels (for example, binary levels) of specific terminals such as an I/O port between the local control unit 31 and the interface 52.

The storage device 53 is a non-volatile storage device such as a flash memory, and stores therein programs and data used by the arithmetic processing unit 54. System setting data 61 are stored in the storage device 53.

The arithmetic processing unit 54 is a computer that includes a CPU (Central Processing Unit), a ROM (Read Only Memory), a RAM (Random Access Memory), and the like, although not shown. The arithmetic processing unit 54 operates as various processing units by loading programs stored in the ROM and the storage device 53 into the RAM and causing the CPU to execute these programs.

In regard to the master system control device (the system control device 22m), the arithmetic processing unit 54 operates as a communication processing unit 71, a system control unit 81, a system monitoring unit 82, a command output unit 91, and a local monitoring unit 92. In regard to the slave system control devices (the system control devices 22s), the arithmetic processing units 54 each operate as the communication processing unit 71, the command output unit 91, and the local monitoring unit 92.

For example, the system setting data 61 include a master/slave setting that specifies either a master or a slave, and the arithmetic processing device 54 refers to the master/slave setting to determine whether the corresponding system control device 22m, 22s operates as a master system control unit or as a slave system control unit.

In the case of the master system control device, the communication processing unit 71 uses the network interface 51 to communicate with the communication processing unit 71 of the slave system control device using a predetermined communication protocol. In the case of the slave system control device, the communication processing unit 71 uses the network interface 51 to communicate with the communication processing unit 71 of the master system control device using a predetermined communication protocol. In this embodiment, for example, Modbus/TCP is used as this communication protocol. For example, network identifiers (IP address, unique identifier for the host protocol, etc.) of the system control devices 22m, 22s, which are communication partners in this communication, are written in the system setting data 61 in advance, so the communication processing unit 71 specifies the communication partner by reference to the system setting data 61.

Moreover, the system control unit 81 of the master system control device transmits a control command to the slave system control device by means of the communication processing unit 71 and the network interface 51. Furthermore, the system monitoring unit 82 of the master system control device receives the status information on the slave system control device from the local monitoring unit 92 of the slave system control device by means of the communication processing unit 71 and the network interface 51.

The command output unit 91 outputs an operation command to the local control unit 31 of the abatement device main body 21 by means of the interface 52. In the case of each slave system control device, the command output unit 91 outputs the abovementioned operation command in accordance with the control command received from the master system control device by the communication processing unit 71. In the case of the master system control device, the command output unit 91 outputs the abovementioned operation command in accordance with the control command supplied from the system control unit 81.

The local monitoring unit 92 acquires the status information from the local control unit 31 of the abatement device main body 21 by means of the interface 52. In the case of each slave system control device, the local monitoring unit 92 transmits the acquired status information to the system monitoring unit 82 of the master system control device by means of the communication processing unit 71 and the network interface 51. In the case of the master system control device, the local monitoring unit 92 sends the acquired status information to the system monitoring unit 82 of the master system control device.

In this manner, each slave system control device (system control device 22s) receives the control command by means of the network interface 51 and supplies the operation command to the abatement device main body 21 in accordance with the received control command.

Also, the communication processing unit 71 of the master system control device (the system control device 22m) periodically and repeatedly polls the communication processing units 71 of the slave system control devices. In so doing, for example, transmission and reception of the status information described above are also executed.

In each slave system control device (each system control device 22s), in a case where the communication processing unit 71 does not receive a polling request within a predetermined time period, it is determined that the communication with the master system control device is disabled. In the master system control device (the system control device 22m), in a case where the communication processing unit 71 does not receive, from a certain slave system control device, a response to the polling request within a predetermined time period, it is determined that the communication with said slave system control device is disabled.

In each slave system control device (each system control device 22s), in a case where the communication processing unit 71 determines that the communication with the master system control device is disabled, in accordance with this embodiment, the command output unit 91 enters stand-alone operation mode. In the stand-alone operation mode, instead of the control command received from the master system control device, an operation command is supplied to the abatement device main body 21 in accordance with a predetermined local setting in the system setting data 61. In other words, even if the control command is no longer supplied from the master system control device, the slave system control device continues the abatement treatment in the stand-alone operation mode.

At that moment, in the stand-alone operation mode, the local control unit 31 determines that the abatement device equipped with the other communication-disabled system control device is inoperable, and issues the status information to the corresponding treatment tool 101-1, 101-2.

When it is determined that the communication with the master system control device is disabled, and when there exists another communication-enabled slave system control device, said slave system control device may start operating as the master system control device for said communication-enabled slave system control device.

In this embodiment, the plurality of abatement devices execute abatement treatments on the gas to be treated that is discharged from the plurality of treatment tools 101-1, 101-2; however, the plurality of abatement devices (the primary abatement devices and the backup abatement device) may execute abatement treatments on the gas to be treated that is discharged from one of the treatment tools.

In this embodiment, although the system control devices 22m, 22s are built into the abatement devices 1-1, 1-2, 2, the system control devices 22m, 22s may be connected to the abatement devices 1-1, 1-2, 2 as devices separate from the abatement devices 1-1, 1-2, 2 and may be installed together with the abatement devices 1-1, 1-2, 2.

Operations of the foregoing abatement system are described next.

In the normal operation, the master system control device (the system control device 22m) transmits a control command to the slave system control devices (the system control devices 22s) to activate the primary abatement devices (the abatement devices 1-1, 1-2) and to bring the backup abatement device (the abatement device 2) into sleep mode. For example, in case of a combustion-type abatement device, in the activated state the abatement device main body 21 supplies a combustible fuel or a combustible gas to a combustion chamber and burns the combustible fuel or combustible gas to perform an abatement treatment on the gas to be treated. In the sleep mode, the abatement device main body 21 maintains the pilot light using a pilot burner without supplying the combustible fuel or combustible gas, so that the abatement device can enter the activated state immediately.

In the normal operation, each primary abatement device (abatement device 1-i, where i=1, 2) issues the status information on said primary abatement device (abatement device 1-i) and the backup abatement device (the abatement device 2) to the treatment tools 101-i (i=1, 2). For example, each treatment tool 101-i adjusts the flow rate of the gas to be treated on the basis of the abovementioned status information, and supplies a command corresponding to the flow rate of the gas to be treated to said primary abatement device (abatement device 1-i). Then, the primary abatement device (abatement device 1-i) controls the abatement treatment in accordance with the command from said treatment tool 101-i. For example, in regard to the combustion-type abatement device 1-i, the flow rate of the combustible fuel or combustible gas is adjusted in accordance with the flow rate of the gas to be treated that is issued by the command.

The master system control device (the system control device 22m) monitors the statuses of the other abatement devices 1-1, 1-2 via the system control devices 22s; for example, in a case where the primary abatement device (abatement device 1-i) is stopped because maintenance is required in the primary abatement device (abatement device 1-i), the state of the backup abatement device (the abatement device 2) shifts to the activated state, and the primary abatement device (abatement device 1-i) is caused to control the bypass valve 11-i to switch the flow channels, and thereafter the primary abatement device (abatement device 1-i) is stopped.

In this manner, during the normal operation, the master system control device (the system control device 22m) and the slave system control device (the system control device 22s) communicate with each other, wherein the master system control device controls the entire abatement system.

On the other hand, when the communication between the master system control device and the slave system control device becomes disabled due to a communication failure of the network 41, power shutdown of the system control device, or the like, the slave system control device (the system control device 22s) enter the stand-alone operation mode. In a case where the primary abatement device (abatement device 1-i) is being activated at the time when the communication becomes disabled, the primary abatement device (abatement device 1-i) is continuously in the activated state in accordance with the predetermined local setting.

On the other hand, in a case where the primary abatement device (abatement device 1-i) is in the sleep mode or stopped at the time when the communication is disabled, said sleep mode or stopped state may be continued in accordance with the predetermined local setting. Alternatively, if possible, the primary abatement device (abatement device 1-i) may be shifted to the activated state (or enter the sleep mode). Note that, when the primary abatement device (abatement device 1-i) is shifted to the activated state, the local control unit 31 thereof drives the bypass valve 11-i to switch the flow channel so that the gas to be treated is caused to flow into the primary abatement device (abatement device 1-i).

Figure 3:
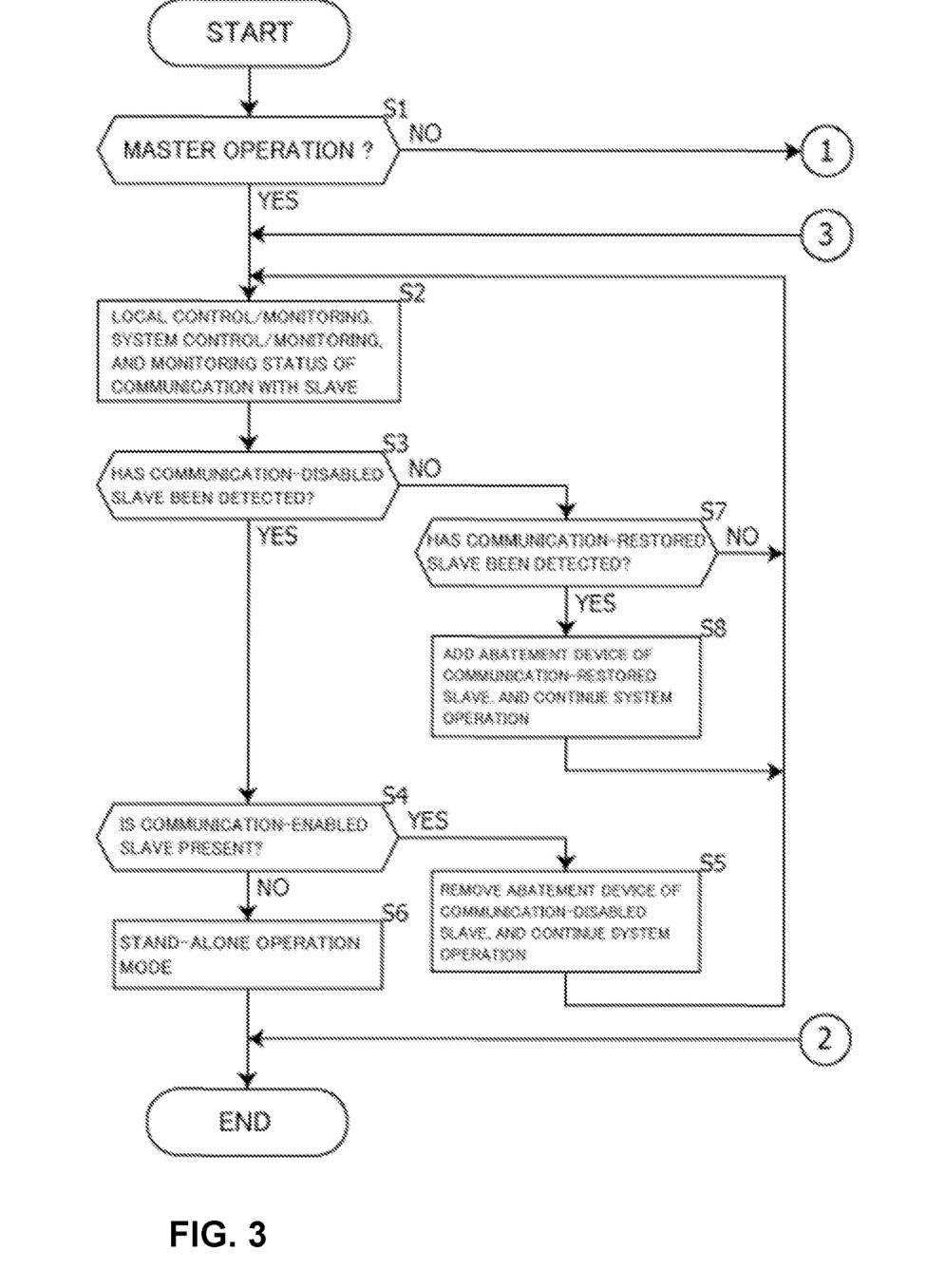
FIG. 3 is a flowchart for explaining operations of the system control devices shown in FIG. 1.
Figure 4:
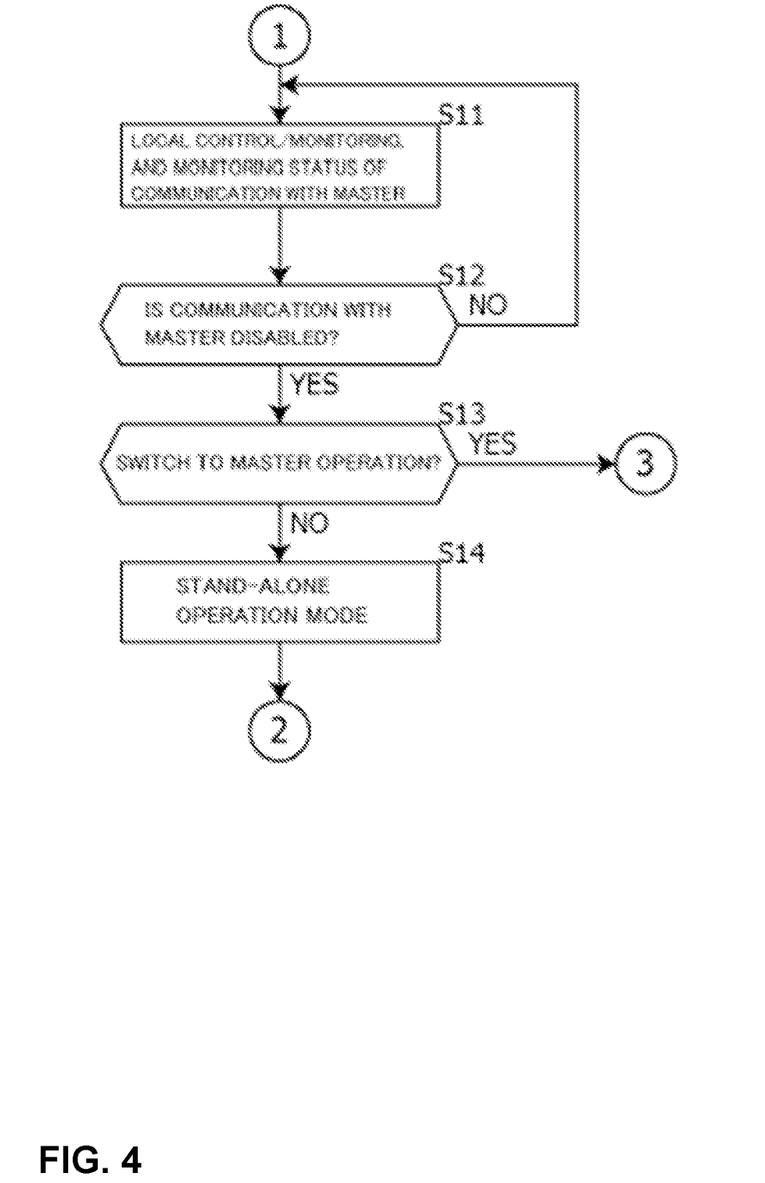
FIG. 4 is a flowchart for explaining the operations of the system control devices shown in FIG. 1.

Operations of each system control device 22m, 22s are now described. FIGS. 3 and 4 are each a flowchart for explaining the operations of the system control devices 22m, 22s shown in FIG. 1.

Once the system control devices 22m, 22s are started, the system control devices read out the system setting data 61 and determine whether the system control devices operate as the master system control devices or the slave system control devices (step S1).

In a case where the system control devices operate as the master system control devices, the system control device 22m controls and monitors the backup abatement device 2, controls and monitors the entire system, and monitors the communication status between the system control device 22m and the system control devices 22s (step S2).

Then, in monitoring the communication status between the system control device 22m and the system control devices 22s, the system control device 22m repeatedly determines whether a communication-disabled system control device 22s is detected or not (step S3).

When the communication-disabled system control device 22s is detected, the system control device 22m determines whether or not there exists a communication-enabled system control device 22s from among the slave system control devices other than the communication-disabled system control device 22s (step S4). In a case where the communication-enabled system control device 22s exists, the system control device 22m removes the communication-disabled system control device 22s from the system and continues to execute the system operation together with the remaining system control device 22s (step S5).

When the communication-disabled system control device 22s is detected and the communication-enabled system control device 22s does not exist, the system control device 22m continues to operate in the stand-alone operation mode (step S6).

Further, in monitoring the communication status between the system control device 22m and the system control devices 22s, the system control device 22m repeatedly determines whether or not a communication-restored system control device 22s is detected among the communication-disabled system control devices 22s (step S7).

In a case where the communication-restored system control device 22s is detected, the system control device 22m adds the communication-restored system control device 22s to the system and continues the system operation (step S8). In this case, when the communication-restored system control device 22s is in the stand-alone operation mode, said system control device 22s returns from the stand-alone operation mode to the operation under the control of the master system control device. In addition, when the communication-restored system control device 22s operates as the master system control device, said system control device 22s switches to the slave system control device and returns to the operation under the control of the master system control device.

On the other hand, when operating as the slave system control devices, the system control devices 22s control and monitor the primary abatement devices 1-1, 1-2, and monitor the communication status between the system control devices 22s and the system control device 22m (step S11).

In monitoring the communication status between the system control devices 22s and the system control device 22m, the system control devices 22s repeatedly determine whether or not the communication with the system control device 22m is disabled (step S12).

When it is detected that the communication with the system control device 22m is disabled, the system control devices 22s determine whether to continue to operate as the master system control devices or not, in accordance with the system setting data 61 and other system control devices 22s (and primary abatement devices) (step S13). In a case where the system control devices 22s do not continue to operate as the master system control devices, the system control devices 22s continue to operate in the stand-alone operation mode (step S14).

On the other hand, in a case where it is detected that the communication with the system control device 22m is disabled, when the system control devices 22s continue to operate as the master system control devices, the system control devices 22s execute the processing following step S2.

As described above, the abatement system according to Embodiment 1 includes the plurality of abatement devices 1-1, 1-2, 2, and a plurality of system control devices 22m, 22s that are provided so as to correspond to the plurality of abatement devices 1-1, 1-2, 2 and supply operation commands to corresponding abatement devices among the plurality of abatement devices 1-1, 1-2, 2. The plurality of system control devices 22m, 22s include the network interfaces 51 that communicate with each other via the network 41. Any one of the plurality of system control devices 22m, 22s functions as the master system control device, and the remaining system control devices among the plurality of system control devices 22m, 22s function as the slave system control devices. Of the plurality of system control devices 22m, 22s, one or more system control devices may function as the master system control devices. The master system control device transmits a control command to the slave system control devices through the network interface 51. The slave system control devices receive the control command through the network interface 51, and supply operation commands to the abatement devices 1-1, 1-2 in accordance with the received control command. Then, when the slave system control devices are not able to communicate with the master system control device, the slave system control devices either function as master system control devices or enter the stand-alone operation mode. Here, in the stand-alone operation mode, an operation command is sent to the abatement devices 1-1, 1-2 in accordance with a predetermined setting.

Therefore, even if the centralized management of the system by a specific master system control device becomes difficult, the slave system control devices can be switched to the stand-alone operation mode or to the master system control device, so that the abatement system can continue to perform an abatement treatment by means of the abatement devices.

Embodiment 2

Figure 5:
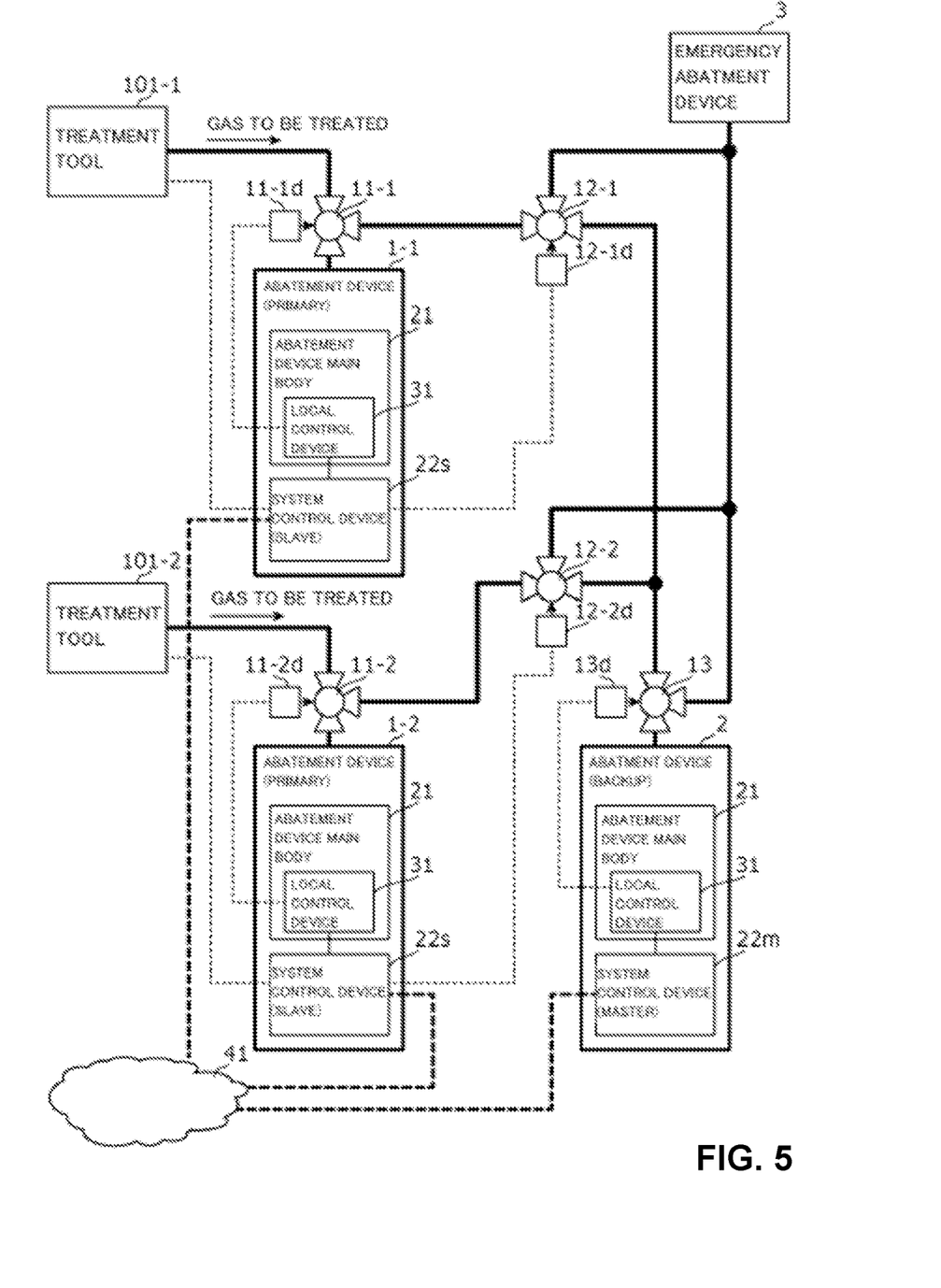
FIG. 5 is a block diagram showing a configuration of an abatement system according to Embodiment 2 of the present disclosure.

FIG. 5 is a block diagram showing a configuration of the abatement system according to Embodiment 2 of the present disclosure. As described above, in Embodiment 2 as well, the bypass valves 12-1, 12-2 are provided between the flow channels of the abatement devices 1-1, 1-2, 2 (the backup flow channels) and the flow channel of the emergency abatement device 3. In Embodiment 2, the bypass valves 12-1, 12-2 are provided with valve drive units 12-1*d*, 12-2*d*, respectively. The valve drive units 12-1*d*, 12-2*d* drive the bypass valves 11-1, 11-2 to switch the flow channels. For example, the valve drive units 12-1*d*, 12-2*d* are each a hydraulic-type, pneumatic-type, or electric-type rotary actuator.

In Embodiment 2, the system control devices 22*s* of the abatement devices 1-1, 1-2 control the valve drive units 12-1*d*, 12-2*d*, respectively, to switch the flow channels of the bypass valves 12-1, 12-2. Specifically, in a case where the system control device 22*m* detects the occurrence of an abnormality on the basis of the abovementioned status information or the like, the system control device 22*m* transmits a command to the system control devices 22*s*, and the system control devices 22*s* switch the flow channels of the bypass valves 12-1, 12-2 in accordance with the command, to cause the gas to be treated to flow into the emergency abatement device 3 through the backup flow channels. In a case where the system control devices 22*s* detect the occurrence of an abnormality on the basis of the abovementioned status information or the like, the system control devices 22*s* autonomously switch the flow channels of the bypass valves 12-1, 12-2, to cause the gas to be treated to flow into the emergency abatement device 3 through the backup flow channels.

In Embodiment 2, the respective treatment tools 101-1, 101-2 issue, to the system control devices 22*s* of the primary abatement devices (here, abatement device 1-*i*, where i=1, 2), commands indicating the flow rate of the gas to be treated at the treatment tools 101-1, 101-2, and in each abatement device 1-*i*, the system control device 22*s* supplies an operation command to the local control unit 31 on the basis of the abovementioned command. The local control unit 31 controls the internal device (reactor or the like), not shown, so that the abatement treatment is appropriately performed based on the flow rate of the gas to be treated in accordance with the operation command. In Embodiment 2, the interface 52 in each system control device 22*s* inputs and outputs signals to and from the local control unit 31, as well as signals (commands and the like) to and from the treatment tools 101-1, 101-2.

Also, in Embodiment 2, the system control devices 22*s* of the primary abatement devices (here, the abatement devices 1-*i*, where i=1, 2) acquire the status information of the abatement device 2 of the other system control device 22*m* from said other system control device 22*m*, and issue the status information on the abatement devices 1-*i* of the system control devices 22*s* and the acquired status information on the abatement device 2 of said other system control device 22*m* to the treatment tools. Specifically, in regard to the treatment tool 101-1, the status information on the abatement devices 1-1, 2 that are likely to perform an abatement treatment on the gas to be treated discharged from the treatment tool 101-1 are issued from the system control device 22*s* of the abatement device 1-1 to the treatment tool 101-1. In regard to the treatment tool 101-2, the status information on all of the abatement devices 1-2, 2 that are likely to perform an abatement treatment on the gas to be treated discharged from the treatment tool 101-2 are issued from the system control device 22*s* of the abatement device 1-2 to the treatment tool 101-2.

Since other configurations and operations of the abatement system according to Embodiment 2 are the same as those of Embodiment 1, the description thereof are omitted herein accordingly.

Various changes and modifications to the foregoing embodiments will be apparent to those skilled in the art. Such changes and modifications may be made without leaving the gist and scope of the subject and without diminishing the intended benefits. In other words, such changes and amendments are intended to be included in the claims.

For example, in Embodiments 1, 2, during the normal operation, one of the system control devices of the primary abatement devices may be used as the master system control device, and the system control device of the backup abatement device may be used as the slave system control device.

Also, in Embodiments 1, 2, the number of pipes from one treatment tool 101-*i* to the abatement devices 1-*i*, 2, that is, the number of inlets of the abatement device 1-*i* is one for the sake of explanation in FIG. 1; however, a plurality of inlets (three, for example) may be used.

Moreover, in Embodiments 1, 2, a plurality of backup abatement devices may be provided for one primary abatement device.

In addition, in Embodiments 1, 2, a bypass valve may be separately provided between the treatment tool 101-1 and the bypass valve 11-1, and a bypass valve may be separately provided between the treatment tool 101-2 and the bypass valve 11-2, and in a case where these separately provided bypass valves are connected by a conduit and the abatement device 2 cannot be used while one of the treatment tools 101-1, 101-2 is not being activated, one of the abatement devices 1-1, 1-2 may be caused to function as the primary abatement device and the other as the backup abatement The present disclosure is applicable to, for example, an abatement system that includes a plurality of abatement devices.

What is claimed is:
1. An abatement system, comprising:
a plurality of abatement devices;
a plurality of valves,
   wherein each valve of the plurality of valves is three-way valve,
   wherein each abatement device of the plurality of abatement devices is associated with a respective valve of the plurality of valves,
   wherein each abatement device of the plurality of abatement devices is configured to control the respective valve by a signal to the respective valve, and wherein the respective valve controls a flow of gas to be treated by the associated abatement device of the plurality of abatement devices; and a plurality of system control devices that are provided corresponding to the plurality of abatement devices, wherein each system control device supplies an operation command to a corresponding abatement device of the plurality of abatement devices, wherein:

the plurality of system control devices respectively include network interfaces for communicating with each other via a network, any one of the plurality of system control devices determines to operate as a master system control device and functions as the master system control device, remaining system control devices of the plurality of system control devices determine to operate as a slave system control device and function as the slave system control devices, the master system control device transmits a control command to the slave system control devices using the network interface, the slave system control devices receive the control command by the network interfaces and supply the operation command to the corresponding abatement device in accordance with the received control command, when unable to communicate with the master system control device, the slave system control devices either function as new master system control devices or enter a stand-alone operation mode, and in the stand-alone operation mode, the operation command is supplied to the corresponding abatement device in accordance with a predetermined setting.

2. The abatement system according to claim 1, wherein the plurality of abatement devices include a primary abatement device that temporarily performs an abatement treatment on gas to be treated that is discharged from a predetermined treatment tool, and a backup abatement device for the primary abatement device, a system control device of the backup abatement device is the master system control device, and a system control device of the primary abatement device is the slave system control device.

3. The abatement system according to claim 1, wherein:

the plurality of abatement devices include a primary abatement device that temporarily performs an abatement treatment on gas to be treated that is discharged from a predetermined treatment tool, and a backup abatement device for the primary abatement device, the plurality of abatement devices each have a local control unit built therein, the local control units control the abatement treatment in accordance with a command from the treatment tool, one of the plurality of system control devices (a) collects status information on the abatement device of said system control device and acquires, from another system control device of the plurality of system control devices, status information on the corresponding abatement device of said another system control device, and (b) causes status information on the plurality of abatement devices to be issued to the treatment tool, and in the stand-alone operation mode, the local control units issue, to the treatment tool, the status information on the plurality of abatement devices indicating that the corresponding abatement device of said another system control device cannot be activated.

4. The abatement system according to claim 3, wherein the one of the plurality of system control devices causes the local control unit of the corresponding abatement device to issue the status information to the treatment tool.

5. The abatement system according to claim 1, wherein the plurality of abatement devices include a plurality of primary abatement devices that temporarily perform an abatement treatment on gas to be treated that is discharged from a plurality of predetermined treatment tools, and one backup abatement device for the plurality of primary abatement devices.

6. The abatement system according to claim 1, further comprising:

an emergency abatement device that temporarily performs an abatement treatment when an abnormality occurs in at least one of the plurality of abatement devices;

a bypass valve of the plurality of valves that is provided between a flow channel of the plurality of abatement devices and a flow channel extending to the emergency abatement device; and a valve drive unit that drives the bypass valve, wherein any of the plurality of system control devices controls the valve drive unit to switch a flow channel of the bypass valve.

7. The abatement system according to claim 1, wherein each abatement device of the plurality of abatement devices receives the flow of gas to be treated discharged from a respective treatment tool;

wherein the corresponding system device for each abatement device is configured to cause status information for at least the corresponding abatement device to be issued to the respective treatment tool; and wherein the respective treatment tool is configured to adjust the flow of gas based on the issued status information.

8. The abatement system according to claim 7, wherein each abatement device includes a respective local control unit, and wherein the corresponding system device is configured cause the respective local control unit to issue status information to the respective treatment tool.

9. The abatement system according to claim 7, wherein each abatement device includes a respective local control unit, and wherein the corresponding system device is configured to cause the local control unit to issue status information for a plurality of abatement devices to the respective treatment tool.

10. An abatement device, comprising:

an abatement device main body; and a system control device that supplies an operation command to the abatement device main body, wherein:

the system control device includes a network interface for communicating with a system control device of another abatement device via a network, determines to operate as a slave system control device and functions as the slave system control device, the system control device of said another abatement device, determines to operate as a master system control device and functions as the master system control device, the slave system control device receives a control command from the master system control device by means of the network interface, and supplies the operation command to the abatement device main body in accordance with the received control command, when unable to communicate with the master system control device, the slave system control device either functions as a new master system control device or enters stand-alone operation mode, the new master system control device transmits a control command to another system control device functioning as another slave system control device, by means of the network interface, in the stand-alone operation mode, the operation command is supplied to the abatement device main body in accordance with a predetermined setting, the abatement device configured to control a first three-way valve by a first signal to the first three-way valve, wherein the first three-way valve controls a first flow of gas to be treated by the abatement device; and the said another abatement device is configured to control a second three-way valve by a second signal to the second three-way valve, wherein the second three-way valve controls a second flow of gas to be treated by the said another abatement device.

11. A system control device that supplies an operation command to an abatement device, the system control device comprising:
   a network interface for communicating with a system control device of another abatement device via a network, wherein:
   the system control device determines to operate as a slave system control device and functions as the slave system control device,
   the system control device of said another abatement device determines to operate as a master system control device and functions as the master system control device,
   the slave system control device receives a control command from the master system control device by means of the network interface, and supplies the operation command to the abatement device in accordance with the received control command,
   when unable to communicate with the master system control device, the slave system control device either functions as a new master system control device or enters stand-alone operation mode,
   the new master system control device transmits a control command to another system control device functioning as another slave system control device, by means of the network interface,
   in the stand-alone operation mode, the operation command is supplied to the abatement device in accordance with a predetermined setting, and
   the abatement device is configured to control a first three-way valve by a first signal to the first three-way valve, wherein the first three-way valve controls a first flow of gas to be treated by the abatement device; and
   the said another abatement device is configured to control a second three-way valve by a second signal to the second three-way valve, wherein the second three-way valve controls a second flow of gas to be treated by the said another abatement device.

* * * * *